United States Patent [19]
Chen et al.

[11] Patent Number: 6,001,538
[45] Date of Patent: Dec. 14, 1999

[54] DAMAGE FREE PASSIVATION LAYER ETCHING PROCESS

[75] Inventors: Sen-Fu Chen, Taipei; Jie-Shing Wu; Fang-Cheng Chen, both of Hsin-chu; Tsung-Tser Lee, Taipei, all of Taiwan

[73] Assignee: Taiwan Semiconductor Manufacturing Company Ltd., Hsin-Chu, Taiwan

[21] Appl. No.: 09/055,442

[22] Filed: Apr. 6, 1998

[51] Int. Cl.$^6$ .............................. G03F 7/40; G03F 7/36; B44C 1/22; C03L 15/00; C23F 1/00
[52] U.S. Cl. .................... 430/316; 216/41; 216/67; 216/72; 430/317; 438/714; 438/738
[58] Field of Search .................... 430/316, 317; 216/41, 67, 72; 438/714, 738

[56] References Cited

U.S. PATENT DOCUMENTS

| | | | |
|---|---|---|---|
| 4,764,245 | 8/1988 | Grewal | 438/714 |
| 5,182,234 | 1/1993 | Meyer | 437/233 |
| 5,296,094 | 3/1994 | Shan et al. | 156/651 |
| 5,549,784 | 8/1996 | Carmody et al. | 156/643.1 |

OTHER PUBLICATIONS

"USLI Technology" by C.Y. Chang et al., The McGraw–Hill Companies, Inc, New York, 1997, p. 354.

*Primary Examiner*—Richard L. Schilling
*Attorney, Agent, or Firm*—George O. Saile; Stephen B. Ackerman

[57] ABSTRACT

A method for etching bonding pad access openings in a passivation layer of an integrated circuit is described. The method utilizes a two step etching procedure wherein the first step etches isotropically through a major portion of the passivation layer under conditions which provide very high etch rate selectivities of the passivation material to the photoresist. These high selectivitities result in virtually no erosion of the photoresist while the greater part of the opening is etched. A second anisotropic etch step wherein the base of the access opening is defined faithfully replicates the dimensions of the mask pattern. This two step etch process permits the use of photoresist layers of moderate thickness as well as photoresist layers with thin regions, such as occur when the photoresist is deposited over the uneven surface topography typically found on unplanarized passivation layers. The minimal erosion of the photoresist during the isotropic etch step secures sufficient photoresist coverage in the thin regions to prevent penetration and attack of passivation over wiring lines in the uppermost wiring level of the integrated circuit.

12 Claims, 4 Drawing Sheets

DAMAGE FREE PASSIVATION LAYER ETCHING PROCESS

BACKGROUND OF THE INVENTION (1) Field of the Invention

The invention relates to processes for the manufacture of semiconductor devices and more particularly to the etching of passivation layers.

(2) Description of prior art

Integrated circuits are manufactured by forming discrete semiconductor devices in the surface of silicon wafers. A multi-level metallurgical interconnection network is then formed over the devices, contacting their active elements, and wiring them together to create the desired circuits. The wiring layers are formed by depositing an insulating layer over the discrete devices, patterning and etching contact openings into this layer, and then depositing conductive material into the openings. A conductive layer is applied over the insulating layer which is then patterned and etched to form wiring interconnections between the device contacts, thereby creating a first level of basic circuitry. The circuits are then further interconnected by utilizing additional wiring levels laid out over additional insulating layers with via pass throughs.

Depending upon the complexity of the overall integrated circuit, one or two levels of patterned polysilicon conductors and two or more levels of metallurgy generally used to form the necessary interconnections and to direct the wiring to large metal pads to which the chip's external wiring connections are bonded.

The metal wiring layers, typically of an aluminum alloy containing copper and silicon, are deposited by sputtering or vacuum evaporation. The final metallization layer includes bonding pads which are typically located in the periphery of the integrated circuit. After the final metallization layer is patterned a passivation layer is applied. This layer seals the device structures on the wafer from contaminants and moisture, and also serves as a scratch protection layer. The passivation layer typically consists of a layer of silicon nitride or phosphosilicate glass (PSG) deposited over a layer of silicon oxide. These layers are deposited by plasma enhanced chemical vapor deposition (PECVD). Openings to the bonding pads are then patterned with photoresist and etched by a plasma etching process.

Referring to FIG. 1, there is shown a cross section of an integrated circuit chip on wafer 10. A multilevel wiring structure is represented by the layer 12. An aluminum alloy bonding pad 16 resides atop the uppermost inter metal dielectric(ILD) layer 14, in a peripheral region 30 of the integrated circuit chip. Interconnective wiring lands 17,18, 19, some of which connect to bonding pads, are located over the device region 40 and form the uppermost wiring level of the integrated circuit. The bonding pad 16 is typically provided with a top anti reflective coating(ARC) of TiN(not shown) which is used during the photolithographic patterning of the metal layer. The passivation layer 20 forms a protective coating over the integrated circuit. After the deposition of the passivation layer 20, a layer of photoresist 24 is applied and patterned to provide an opening 26 to the bonding pad 16 so that the pad may be wire bonded to the external chip package.

In a conventional process the passivation layer 20 is etched by reactive ion etching(RIE) or plasma etching using well known etchants containing fluorocarbons. A problem with the conventional anisotropic RIE process for etching the passivation layer 20 to expose bonding pads is caused by thin regions of photoresist occurring over the edges 28 of metal lines. The thinning of the photoresist is related to the spacing between the lines, not occurring over narrowly spaced lines 17 and 18, but significant over the edges of the wider spaced lines 18 and 19 at over the bonding pad 16 edges.

FIG. 2 shows the photoresist profile after etching the passivation layer to form the bonding pad opening 26 using RIE. Because of the relatively low selectivities of the oxide and nitride layers relative to photoresist, the thin regions 28 are often penetrated by the etchant resulting in damage to the passivation layer. The obvious solution to this problem is to use a thicker photoresist layer. The photoresist thicknesses typically used for this process are of the order of 2.5 microns. In order to avoid penetration at the thin regions over the metal lands by the passivation layer RIE, photoresist coatings of greater than 3.5 microns are required. A thicker photoresist layer slows the photolithography step thereby reducing its throughput. In addition thicker photoresist coatings require a higher exposure energy and tend to under develop. A better solution to the problem is to improve the etch selectivity of the passivation layer etch.

A number of etchant chemistries have been developed and applied in the semiconductor industry, each combination typically finding a niche application to a unique problem. New chemistries have replaced earlier ones with added benefits in unique applications. A few are cited in Chang, C. Y., and Sze, S. M., ULSI Technology, McGraw-Hill, New York (1997), p354. Carmody, et.al., U.S. Pat. No. 5,549,784 cites the addition of helium to the etchant chemistry for the formation of contact openings. The helium addition reduces gate charging resulting from damage to the gate oxide.

Process variations such as replacing single step process operations with multiple step operations have solved numerous processing problems in the past, many of which arose as a direct result of the trend toward increasing device density and integrated circuit miniaturization. Shan, et.al., U.S. Pat. No. 5,296,094 cites a method for contact etching using a two step approach wherein a problem of micro masking is resolved. A first step etches the bulk of the insulator material in the opening under conditions to avoid micro masking and a second step etches the remainder of the insulator material under conditions giving a high etch rate selectivity.

Meyer, U.S. Pat. No. 5,182,234 shows a method for etching silicon isotropically or anisotropically with $SF_6/O_2$ mixtures wherein the amount of $O_2$ in the gas flow determines the degree of isotropy.

SUMMARY OF THE INVENTION

Accordingly, it is an object of this invention to provide an improved method for etching openings in a passivation layer.

It is another object of this invention to disclose a method for etching openings in a non-planarized insulative layer wherein the etch mask has thin regions without increasing the mask thickness to accommodate the thin regions.

It is yet another object of this invention to disclose a method for etching openings in a non-planarized insulative layer with reduced photoresist thickness.

These objects are accomplished by etching a first and major portion of the opening in the insulative layer isotropically with an etchant combination which provides high selectivity of the insulative layer over the etch mask, which in the embodiment of the current invention, comprises photoresist. The second, smaller and final portion of the insulative layer is then etched anisotropically, with a second etchant gas mixture, thereby retaining the mask dimensions at the base of the opening. The photoresist layer suffers practically no erosion during the isotropic etch step. The thin regions can then survive the RIE.

The entire etching procedure may be performed in a single RIE etching tool wherein a load lock is fitted with plasma etching capabilities. The isotropic etching is performed in the load lock and the wafer is then transferred into the main etch chamber of the RIE tool for the anisotropic etch.

The method is particularly well suited for etching openings to terminal bonding pads in a passivation layer consisting of silicon nitride over a silicon oxide layer wherein the silicon nitride layer is etched isotropically and the the silicon oxide layer is etched anisotropically by RIE.

By completing the etched opening anisotropically, the mask dimensions may be replicated without bias at the base of the opening.

DESCRIPTION OF THE PREFERRED EMBODIMENT

Figure 1:
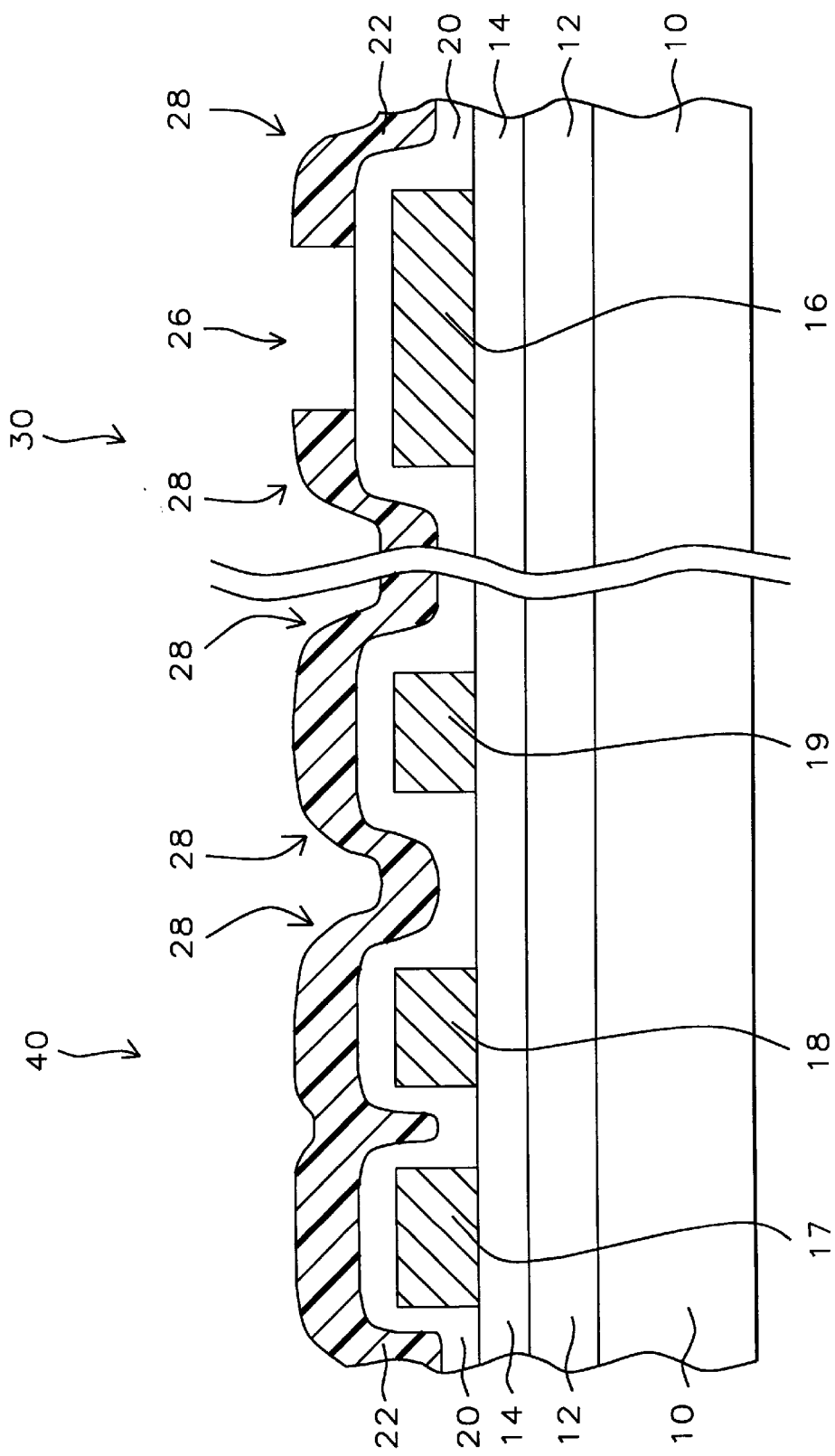
FIG. 1 is a cross section of an integrated circuit wafer showing a mask pattern on a passivation layer over metallization wiring and a bonding pad before etching the passivation layer.
Figure 2:
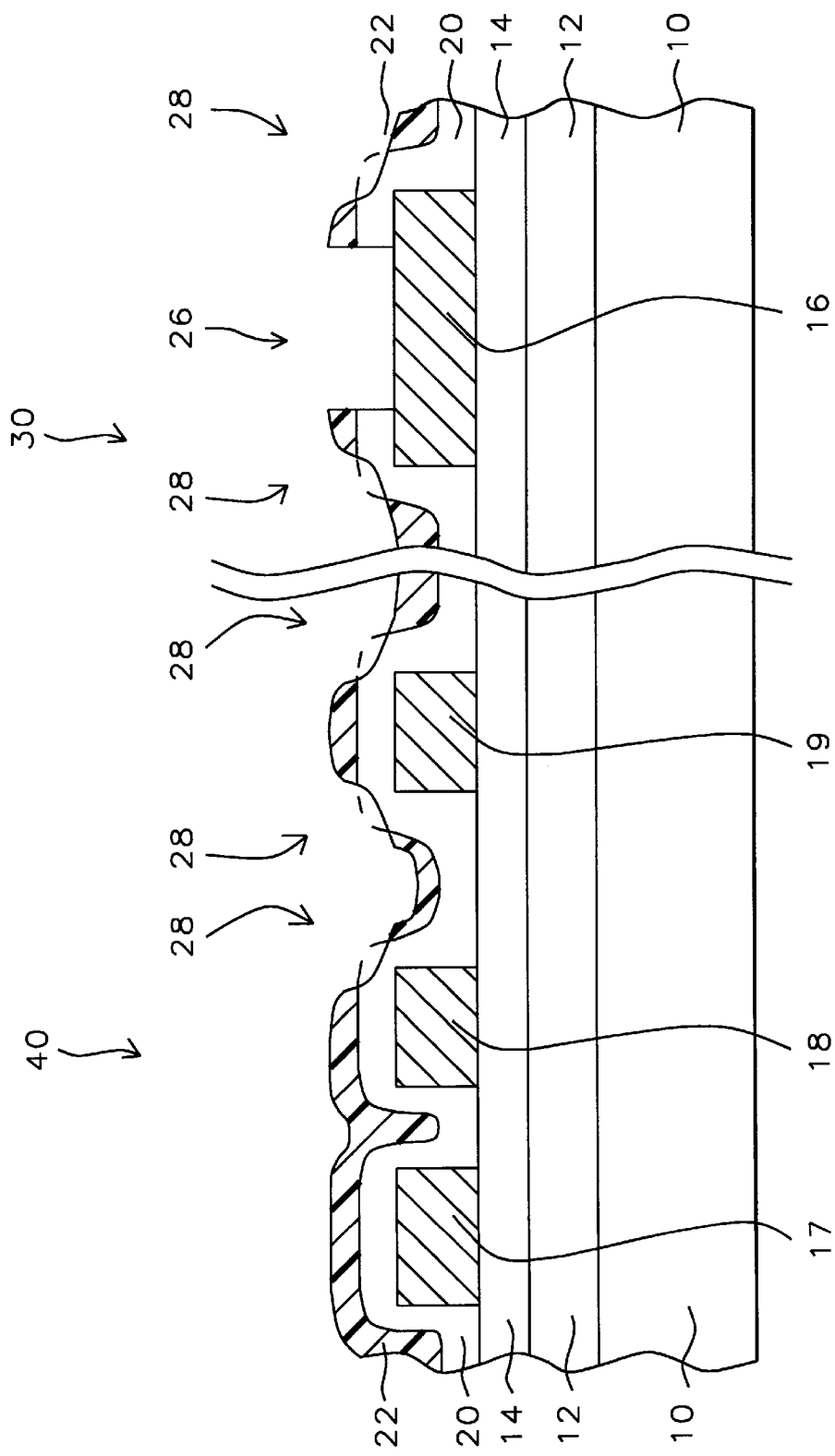
FIG. 2 is a cross section of an integrated circuit wafer showing a mask pattern on a passivation layer over metallization wiring and a bonding pad after etching the passivation layer by a prior art etch process.

In a preferred embodiment of this invention an access opening to an aluminum alloy bonding pad is formed through a passivation layer. Referring to FIG. 1, a silicon wafer 10 having integrated circuit devices formed on its surface is provided. A plurality of wiring patterns are formed over the wafer separated by insulative layers and interconnected through contacts and vias using integrated circuit processes well known by those skilled in the art. These layers and wiring patterns are represented in the figure by the layer 12. The wiring patterns are terminated at aluminum alloy bonding pads formed over a final layer of an insulative material 14 typically in the periphery of the integrated circuit chip.

One such bonding pad 16 in a peripheral region 30 is shown in cross section in FIG. 1. The bonding pad 16 is typically about 100 microns by 100 microns in size and is patterned in an aluminum alloy layer which also encompasses the interconnective wiring stripes 17,18,19 in the device region 40. The upper surface of the aluminum alloy layer is coated with a thin TiN ARC layer(not shown). The stripes 17,18,19 form interconnections between subjacent circuits and connections to bonding pads.

After the metal lines are patterned, a passivation layer 20 is deposited over the wafer. The passivation layer 20 in this embodiment comprises a silicon oxide layer 20A with a silicon nitride layer 20B deposited over it. The layers are deposited by PECVD. The silicon oxide layer is between about 2,000 and 5,000 Å thick and the silicon nitride layer is between about 5,000 and 7,000 Å thick. A photoresist layer 22 is deposited on the passivation layer 20 and patterned by well known photolithographic techniques to define an access opening 26 to the bonding pad 16. The photoresist layer 22 is between about 2.5 and 3.5 microns thick.

The wafer is next loaded into a plasma etching tool of the type whereby wafers are loaded into an entry load lock from a cassette. A typical tool so equipped is the Model 4520 Etcher manufactured by LAM Research Corporation of Fremont Calif.

The entry lock of the etching tool is equipped with gas flow and pressure control capabilities. In addition the lock is fitted with an electrode to permit the striking of an rf glow discharge. Methods for implementing such modifications are well known and comprise uncomplicated engineering procedures. These modifications enable isotropic plasma etching in the load lock chamber prior to transfer of the wafer to the main etch chamber.

Figure 3:
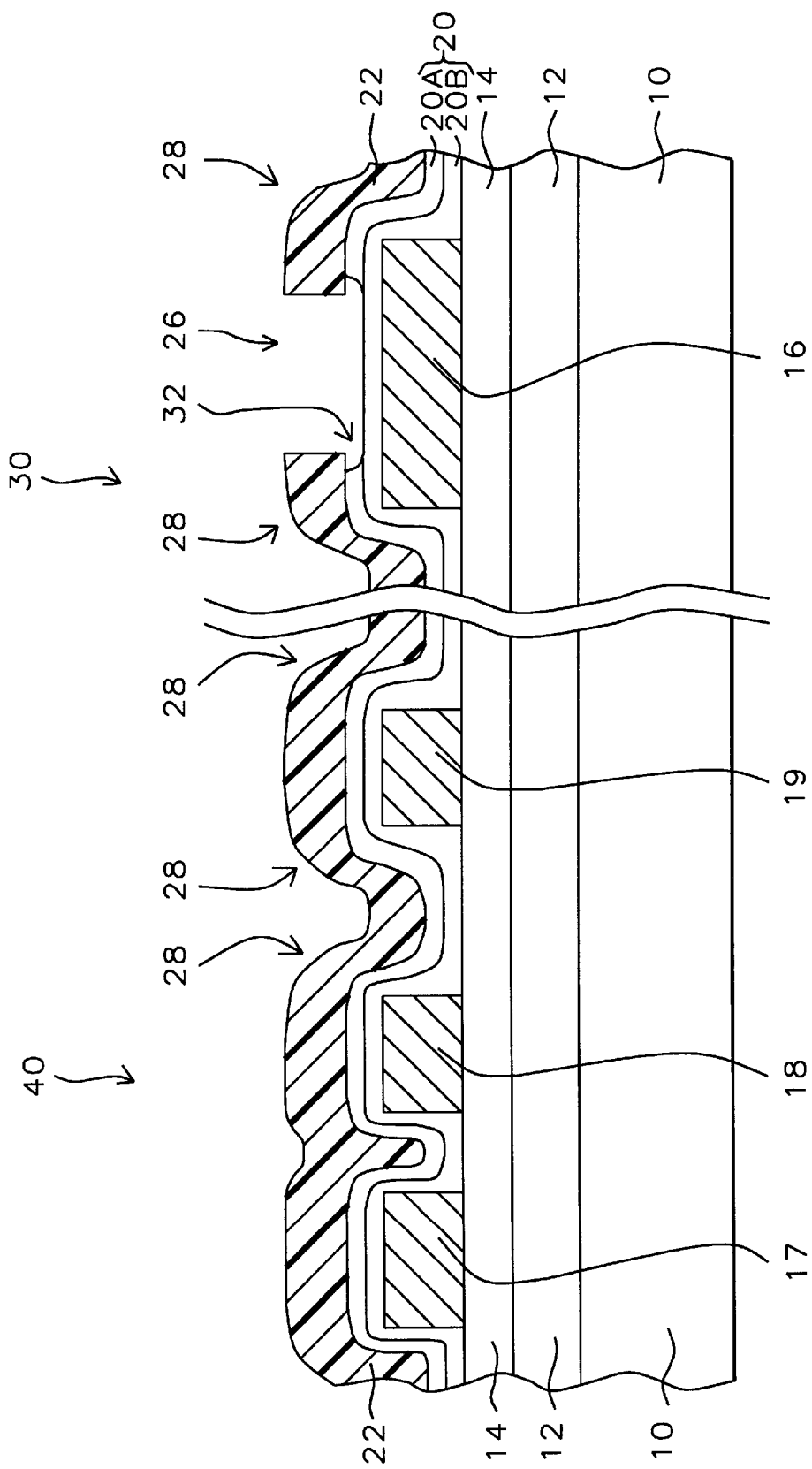
FIG. 3 is a cross section of an integrated circuit wafer showing a mask pattern on a passivation layer with a partially etched opening to a bonding pad after a first etching step according to the process of this invention.
Figure 4:
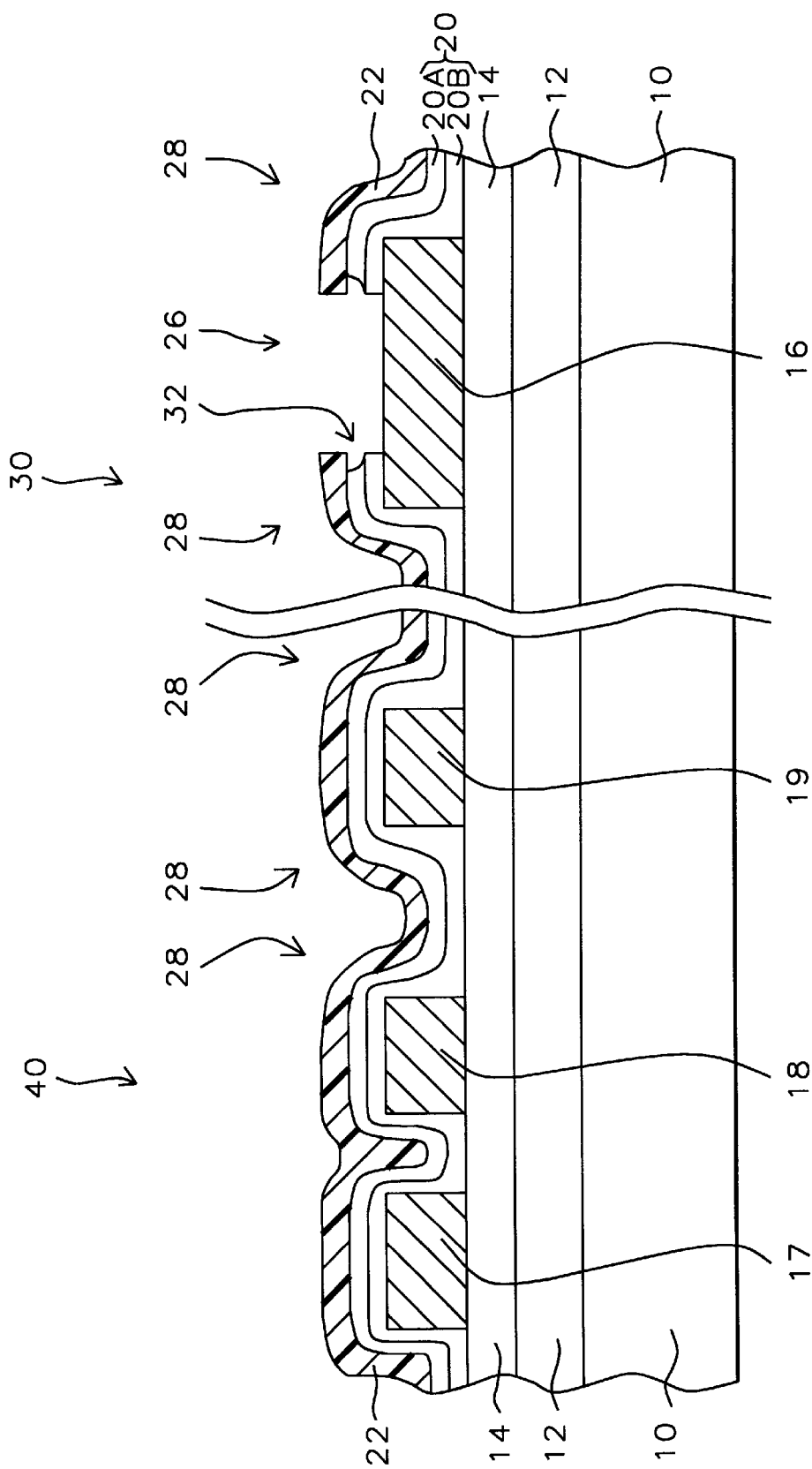
FIG. 4 is a cross section of an integrated circuit wafer showing a mask pattern on a passivation layer with a completely etched opening to a bonding pad after a second etching step according to the process of this invention.

The wafer is loaded from a cassette into the load lock of the etching tool and the lock is evacuated. Referring now to FIG. 3, the etching of the access opening 26 is begun by isotropically etching the patterned opening through the passivation layer 20 with a gas mixture containing $NF_3$ at a flow rate of between about 300 and 500 SCCM in a helium carrier gas. The helium flow rate is between about 300 and 500 SCCM and is regulated to maintain a chamber pressure of between about 1,000 and 1,500 mTorr. A plasma having a power density of 500 watts or thereabout is struck and the nitride portion 20A of the passivation layer is etched isotropically. As can be appreciated form the data in Table I, the etch rate selectivity for the nitride etch provided by the isotropic process(85:1) is about 90 times better than that for the anisotropic process(0.94:1). The corresponding benefit for the oxide etch process is about ten-fold. Clearly it is advantageous to accomplish the entire nitride etch isotropically in the load lock and relegate the remaining oxide portion to anisotropic etching in the main chamber. Therefore the isotropic etching is maintained until a thickness of about 2,000 Å of the oxide layer 20B remains.

Table I lists the selectivities as well as the actual measured etch rates of $Si_3N_4$, $SiO_2$, and photoresist. Not only are the selectivities high but, more importantly, the etch rate of photoresist is essentially insignificant, leaving the thin regions 28 virtually unscathed.

By performing the bulk of the required etching isotropically without any significant loss of photoresist, the remainder of the opening can then easily be accomplished anisotropically in the main etch chamber.

TABLE 1

|  |  | Step #1 4520-ISO $NF_3$/He | Step #2 4520-Main Chamber $CF_4$/$CHF_3$/Ar |
|---|---|---|---|
| PE-$Si_3N_4$ | Etch Rate (Å/min) | 12,000 | 4,757 |
|  | Uniformity | 6.30% | 2.90% |
| PE-$SiO_2$ | Etch Rate (Å/min) | 2,104 | 7,727 |
|  | Uniformity | 1.80% | 2.80% |
| Photoresist | Etch Rate (Å/min) | 120 | 5,047 |
|  | Uniformity | 17.60% | 10.30% |
| Selectivity | PE-$Si_3N_4$/PR | 85 | 0.94 |
|  | PE-$SiO_2$/PR | 16 | 1.53 |

PE = Plasma Enhanced
PR = Photoresist

FIG. 3 is a cross section showing the photoresist and passivation layer profile following the isotropic etch. The passivation layer 20 is somewhat undercut 32 because of the isotropic etching. However, a sufficient portion of the layer remains to properly replicate the photoresist image at the base of the bonding pad opening 26 by the subsequent RIE step.

The wafer 10 is next transferred into the main etch chamber of the 4520 etching tool wherein it is placed on a the cathode plate. The final RIE step of the oxide portion 20B of the passivation layer etch then proceeds. An etchant gas mixture containing $CF_4$ at a flow rate of between about 20 and 80 SCCM, $CHF_3$ at a flow rate of between about 20 and 80 SCCM is admitted to the main chamber in an Argon carrier gas. The carrier gas flow rate is between about 100 and 400 SCCM and is regulated to maintain a chamber pressure of between about 150 and 300 mTorr. A plasma of 800 watts or thereabout is struck and the oxide layer 20B is etched to endpoint. Endpoint is determined by well known methods such as optical emission spectroscopy wherein the components of the etching plasma are observed over time. An over etch period, preferably of at least 50%, is provided to assure complete removal of the oxide. A flow between about 10 and 30 SCCM of $SF_6$ is then added to the $CF_4/CHF_3$ flow for a timed period to remove the TIN ARC layer, enabling complete exposure of the metal bonding pad.

The oxide etch rate in the fluorocarbon RIE etch step is over three fold greater than that in the isotopic etch step(See Table I). Although the photoresist etch rate is now significantly higher, its exposure time to the RIE is much reduced over the single step RIE process because the nitride layer 20A is already gone. The fluorocarbon mixture also has a high selectivity of silicon oxide-to-bonding pad metal (approximately 800:1) so that negligible metal attack occurs during the first over etch period.

While the invention has been particularly shown and described with reference to the preferred embodiments thereof, it will be understood by those skilled in the art that various changes in form and details may be made without departing from the spirit and scope of the invention.

What is claimed is:

1. A method for etching an insulative layer to provide an opening to a metal pad:
   (a) providing a silicon wafer having a metal pad over which has been deposited a composite layer comprising a first insulative layer and a second insulative layer on said first insulative layer;
   (b) depositing a masking layer over said silicon wafer;
   (c) patterning said masking layer to define an access opening to said metal pad;
   (d) isotropically etching said second insulative layer and a first portion of said first insulative layer in a plasma containing a first gas mixture; and
   (e) anisotropically etching a remaining portion of said first insulative layer in plasma containing a second gas mixture thereby exposing said metal pad.

2. The method of claim 1 wherein said first insulative layer is selected from the group consisting of silicon oxide, and a silicate glass.

3. The method of claim 1 wherein said second insulative layer is selected from the group consisting of silicon nitride, silicon oxynitride, and a phosphosilicate glass.

4. The method of claim 1 wherein said metal pad is selected from the group consisting of aluminum, and an aluminum alloy.

5. The method of claim 1 wherein said masking layer is photoresist.

6. The method of claim 5 wherein said masking layer is between about 2.5 and 3.5 microns thick.

7. The method of claim 1 wherein said first gas mixture contains $NF_3$ at a flow rate of between about 300 and 500 SCCM, in a helium carrier gas at a pressure of between about 1.0 and 1.5 Torr.

8. The method of claim 1 wherein said second gas mixture contains $CF_4$ at a flow rate of between about 20 and 80 SCCM, and $CHF_3$ at a flow rate of between about 20 and 80 SCCM in an argon carrier gas whose flow rate is regulated to maintain a chamber pressure of between about 150 and 300 mTorr.

9. The method of claim 8 wherein said metal pad is coated with a TiN ARC layer.

10. The method of claim 9 further comprising etching said TiN ARC layer by adding a flow of between about 10 and 30 SCCM $SF_6$ to said second gas mixture after said remaining first insulative layer has been removed.

11. The method of claim 1 wherein said anisotropic etching is reactive ion etching.

12. The method of claim 1 wherein a said remaining portion of said first insulative layer is over etched by at least 50% percent.

* * * * *